United States Patent [19]

Delegue

[11] 4,354,245
[45] Oct. 12, 1982

[54] CYCLIC OR PERIODIC ANALOG SIGNAL PROCESSING CIRCUIT

[75] Inventor: François E. Delegue, Paris, France

[73] Assignee: Thomson-CSF, Paris, France

[21] Appl. No.: 175,877

[22] Filed: Aug. 6, 1980

[30] Foreign Application Priority Data

Aug. 10, 1979 [FR] France ................................ 79 20521

[51] Int. Cl.³ .............................................. G06J 1/00
[52] U.S. Cl. .............................. 364/606; 340/347 SY; 364/434; 364/607
[58] Field of Search ............... 364/600, 602, 606, 607, 364/426, 434; 340/347 SY, 347 AD, 347 DA

[56] References Cited

U.S. PATENT DOCUMENTS

| | | | |
|---|---|---|---|
| 3,449,553 | 6/1969 | Swan | 364/606 X |
| 3,558,863 | 1/1971 | Williams, Jr. et al. | 364/606 X |
| 3,573,794 | 4/1971 | Widenor | 340/347 SY |
| 4,159,524 | 6/1979 | Schollmeier et al. | 364/606 |
| 4,270,177 | 5/1981 | Endoh et al. | 364/606 X |

FOREIGN PATENT DOCUMENTS

| | | | |
|---|---|---|---|
| 2318519 | 10/1974 | Fed. Rep. of Germany | 364/606 |
| 2346905 | 10/1977 | France | 364/606 |

OTHER PUBLICATIONS

Bonwit et al., "CESSAM: Conversion Equipment System, Surface-to-Air Missiles", IEEE International Convention Record, vol. 15, No. 3, Mar. 20-23, 1967, pp. 81-86.

Primary Examiner—Joseph F. Ruggiero

[57] ABSTRACT

This circuit makes it possible to produce in digital form position data corresponding to analog signals supplied by linvar transducers for processing by a digital computer. It comprises a multiplexer for successively transmitting the linvar signals to a processing circuit comprising, a comparator with a digital output for comparing the measuring signal of a transducer with the corresponding supply signal after the latter has been multiplied by an analog coefficient corresponding to a digital value stored in a memory relooped on itself across an adder-subtracter, which is controlled from the comparator output for agreeing the value $V_M/V_R$, to within an integration quantity.

7 Claims, 8 Drawing Figures

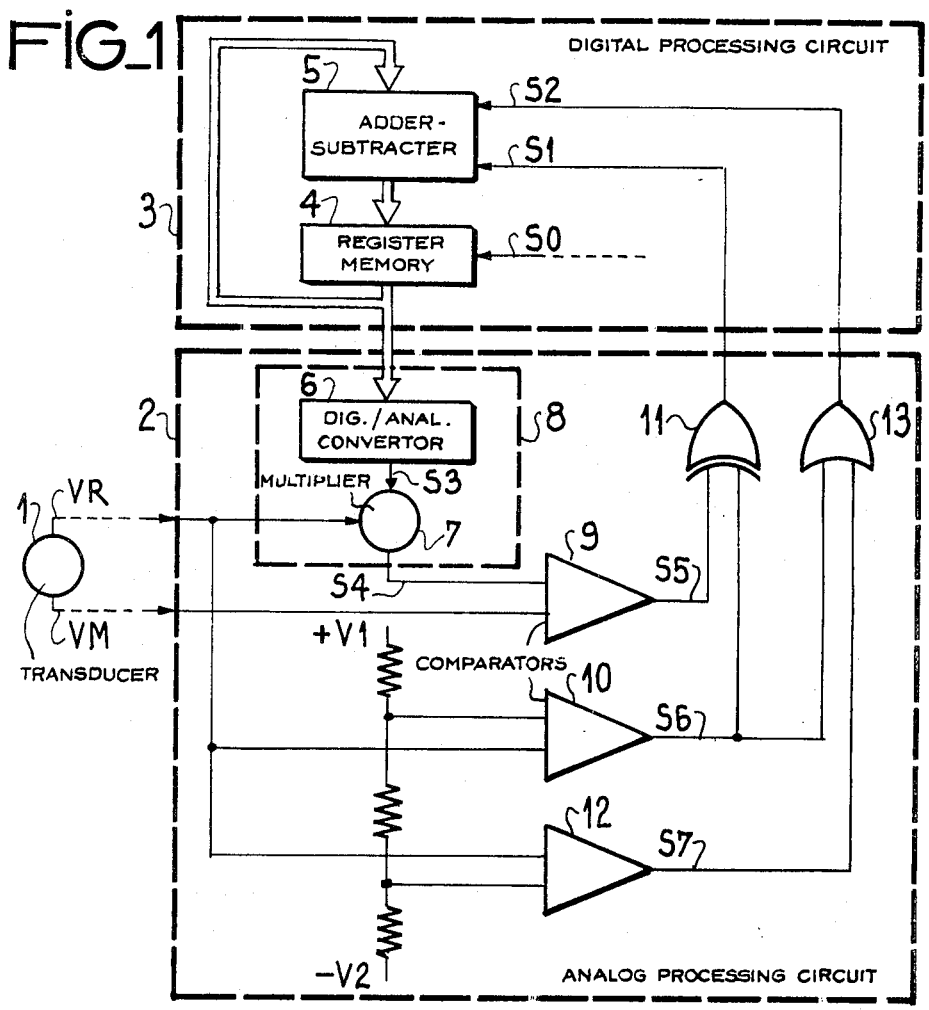
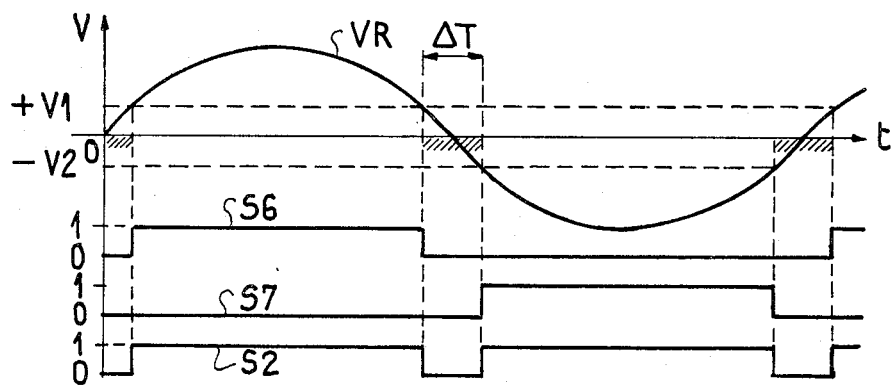

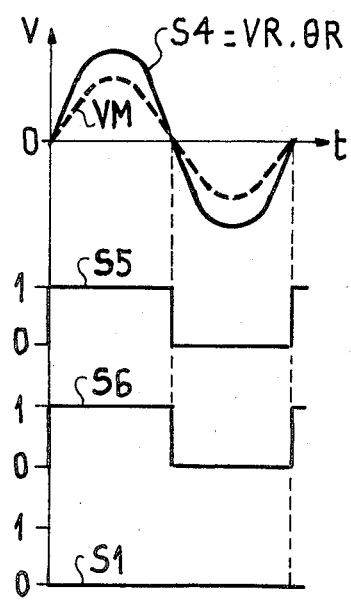
FIG_2-a
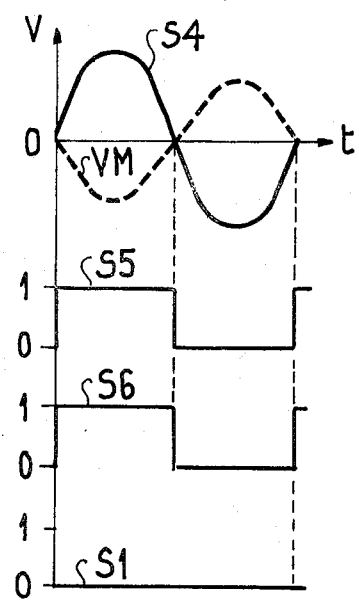
FIG_2-b
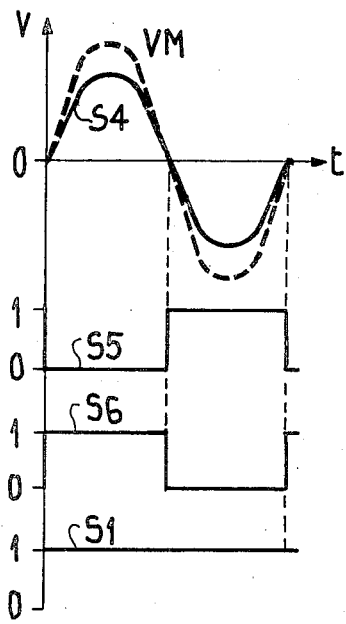
FIG_2-c
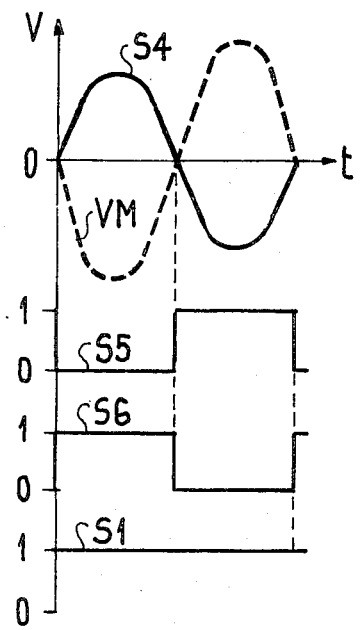
FIG_2-d

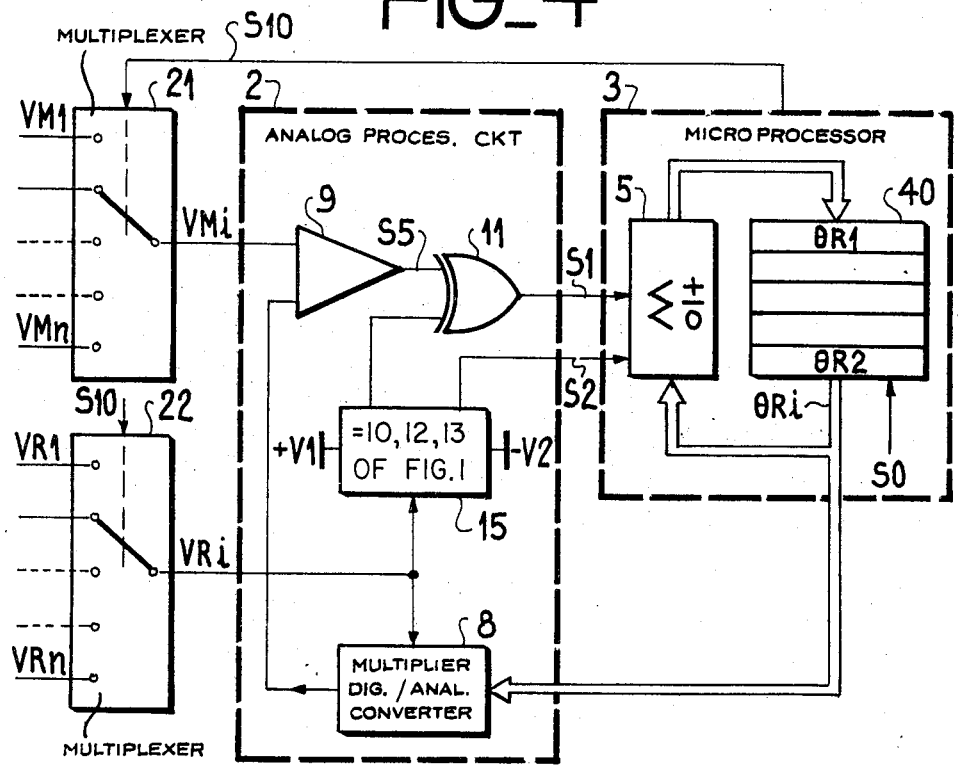
FIG_4
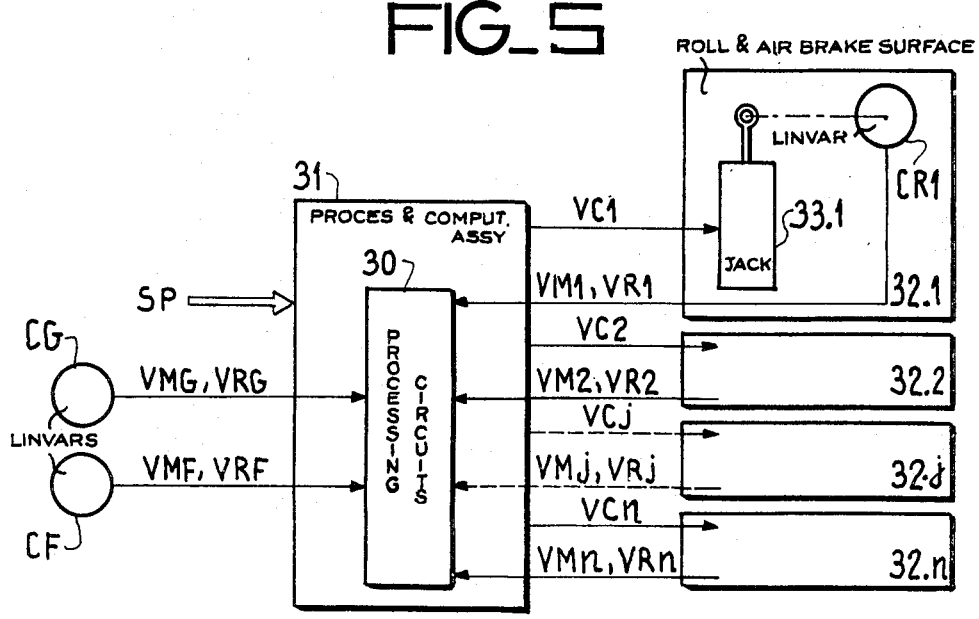
FIG_5

CYCLIC OR PERIODIC ANALOG SIGNAL PROCESSING CIRCUIT

BACKGROUND OF THE INVENTION

The present invention relates to a cyclic or periodic analog signal processing circuit.

More specifically, the processing according to the invention is directed at signals produced by a plurality of sensors or transducers, each of which supplies a shaped measuring signal $V_M = K V_R \theta$ in which K is a constant, $V_R$ a cyclic reference signal supplying the transducer and $\theta$ the information to be measured corresponding to a linear or angular displacement.

Linear variometers or linvars produce such signals. They constitute variable coupling transformers whose induced voltage is a linear function of the positioned information $\theta$ to be measured. The latter corresponds to an angular displacement of the rotor in the case of construction in the form of a rotating machine. There are also constructions with linear displacement, for example of a core in order to vary the coupling and collect the voltage induced at the corresponding winding terminals.

These inductive transducers are generally realised in systems having a logic computing unit which digitally processes data and it is consequently necessary to introduce an intermediate circuit performing the transformation and conversion operations for processing by the computer.

The main object of the invention is to provide such a circuit in simple form leading to greater compactness and reduced weight and, as will be shown hereinafter, providing greater reliability. These properties are particularly advantageous in producing a system of electrical flight controls in accordance with a particularly advantageous application envisaged for the invention. Other advantageous applications of the invention include the digital control of machines.

The conventional solution for the processing of cyclic signals $V_M$ and $V_R$ from different transducers consists of firstly transforming them into continuous signals. For this purpose, each signal is applied to a demodulator circuit which performs a peak or surface demodulation and which is followed by a filter circuit. The signals obtained at the output of the filters must then undergo analog-digital conversion by one of the known processes (coder with successive approximations, coder with single or multiple ramps) supplying the information $\theta R_i$ given by the ratio between the measuring signals $V_{Mi}$ and the associated reference signal $V_{Ri}$. The different ratios $V_{M1}/V_{R1}, V_{M2}/V_{R2}, \ldots V_{Mn}/V_{Rn}$ can thus be sequentially stored in a computer memory. Due to the multiplexing of the filter outputs, it is possible to use a single analog-digital coder circuit processing the ratio $V_{Mi}/V_{Ri}$, but which nevertheless forms the most expensive element in the string. Due to the reaction times of the demodulators and particularly the following filters it is substantially impossible to obtain a single channel for the acquisition by multiplexing of these elements and this must therefore be performed as two n independent channels respectively processing the different signals $V_{M1}$ to $V_{Mn}$ and $V_{R1}$ to $V_{Rn}$.

BRIEF SUMMARY OF THE INVENTION

A processing circuit according to the invention obviates these disadvantages by processing the various data $\theta$ to be measured without using either demodulators or filters.

According to a feature of the invention, each measuring signal $V_{Mi}$ is compared in a comparator circuit with the reference signal $V_{Ri}$ associated therewith after the latter has been multiplied by an analog coefficient corresponding to a digital value stored in a memory circuit which is relooped on itself across an adder-subtracter circuit, the latter being controlled on incrementation or decrementation as a function of the state of the digital output of the comparator in such a way as to rally the real value $V_M/V_R$ for the stored value to within an incrementation quantity.

BRIEF DESCRIPTION OF THE DRAWINGS

Other features of the invention will be more apparent to those skilled in the art on consideration of the following description and accompanying drawings, wherein show:

FIG. 1—a simplified diagram of a cyclic analog signal processing circuit according to the invention.

FIGS. 2a to 2d and FIG. 3—wave shapes relative to the operation of the circuit of FIG. 1.

FIG. 4—a processing circuit diagram according to the invention.

FIG. 5—a diagram of the application to an electrical flight control system.

DETAILED DESCRIPTION OF THE PREFERRED EMBODIMENTS

The present process is shown on the diagram of FIG. 1 where, for reasons of simplification, consideration is only given to one pair of signals $V_M$ and $V_R$ to be processed, said signals coming from a transducer 1. The processing circuit has been subdivided into two subassemblies 2 and 3 substantially corresponding to the part performing an analog treatment and the part performing a digital treatment. The latter part has a memory 4 of the register type which is relooped on itself across an adder-subtracter circuit 5. The register 4 is timed by a clock signal So. With the exception of a sign bit, the number N of bits of the register will be determined as a function of the desired precision. For each clock signal, the register content is increased by a given quantity (incrementation) for example the value 1 or is decreased by said quantity (decrementation) or remains identical, as a function of the two possible control states of each of the signals S1 and S2 applied to the circuit 5. Signal S1 controls the sign of the sum operation and constitutes the increase/decrease signal and the so-called validity signal S2 authorises or fails to authorise the operation in accordance with the following table:

| S1 | S2 | ACTION PERFORMED BY CIRCUIT 5 |
|---|---|---|
| 1 | 1 | ADDITION |
| 0 | 1 | SUBTRACTION |
| 1 | 0 | NO ACTION |
| 0 | 0 | " |

The output from register 4 is also transmitted to subassembly 2 to digital-analog conversion circuit 6 followed by an analog multiplier circuit 7. The latter receives by a first input the output S3 of the conversion circuit and by a second input the reference signal $V_R$. Circuits 6 and 7 can be integrated circuits in the form of a single circuit 8 of the multiplier-digital-analog converter type. The output S4 of the multiplier is compared with the measuring signal $V_M$ in a comparator circuit 9 with a digital output. Signal S5 sampled at said output has for example the value 1 when S5 exceeds $V_M$ and 0 in the opposite case.

The present signals $V_M$ and $V_R$ are periodic or cyclic and cancel one another out at the same time. The different possible configurations are shown in FIGS. 2a to 2d, signal $V_R$ being considered as of a sinusoidal shape (alternating signal). Signal S4 corresponds to signal $V_R$ multiplied by the conversion value S3. By calling $\theta_R$ the recopy analog value stored in binary form in register 4, we obtain $S4 = V_R \cdot \theta_R$. Depending on whether $V_R \cdot \theta_R$ is greater than or smaller than $V_M$ and in phase or in phase opposition therewith we obtain the four configurations shown below which there is the corresponding variation for signal S5 resulting from the comparison at 9. It should be noted that information S5 is inadequate for controlling the incrementation or decrementation by comparing FIGS. 2a and 2c on the one hand and FIGS. 2b and 2d on the other. It is therefore necessary to reverse the instantaneous information S5 ($V_M > \theta_R V_R$ and $V_M < \theta_R V_R$) to take account of the polarity reversal of reference signal $V_R$ and obtain an absolute value of the comparison leading to the incrementation or decrementation command S1. This function is fulfilled by means of a second comparator circuit 10 with a digital output and an exclusive-OR circuit 11. The reference signal $V_R$ is compared in circuit 10 with a voltage V1 which, a priori, is assumed to be zero in such a way that states 1 and 0 of output S6 of this comparator respectively translate the positive and negative polarity of signal $V_R$. Signals S5 and S6 are applied to the inputs of the exclusive-OR circuit 11 which supplies the corresponding increase or decrease information S1. The adder-subtracter 5 corrects the value of $\theta_R$ in the favorable direction for agreeing the value $V_M/V_R$. When its equilibrium is reached, the content $\theta_R$ oscillates about the value $V_M/V_R$ and encloses it to within an incrementation-decrementation quantity. The final function performed is that of a cyclic tracking analog-digital coder.

It should be remembered that the clock signal So makes it possible to sample the signals and that the clock frequency is determined on the one hand as a function of that 1/T of the signals to be processed to obtain a given number of samples per cycle T, and on the other hand in such a way that separate samples are taken during successive cycles, thus passing through all the signals. Thus, the clock frequency must not be a multiple or submultiple of the frequency 1/T of the signals $V_R$ and $V_M$. The samples are therefore taken in a noncorrelated manner relative to the signal $V_M$ to be coded.

The control of the adder-subtracter circuit 5 by the incrementation-decrementation signal S1 is validated by a signal S2. The validation can be determined to act either on the absolute value of the increment (increment or zero) or by inhibition of the clock signal S0 (thereby retaining the previous value). Bearing in mind the non-correlation of the selected clock frequency and of that 1/T of the signals to be processed, samples are obtained at different times in the cycle and in particular at the zero passages of the various signals. At these times and in the vicinity thereof, the comparison by the circuits 9 and 10 no longer serves any purpose and merely causes a noise. To avoid this noise and the resulting operational disturbance, the result S1 of the comparisons is invalidated in a range corresponding to the vicinity of the zero passages. For this purpose, the comparator 10 is associated with a third comparator 12 having a digital output and an OR circuit 13. The reference signal $V_R$ is compared at 10 with a positive low amplitude voltage $V_1$ and at 12 with a negative low amplitude voltage $V_2$. The values $V_1$ and $V_2$ are selected for determining the sampling interdiction range $\Delta T$ about the zero passages. The operation is shown on the curves of FIG. 3 in which S7 represents the output of comparator 12 transmitted with S6 to the OR circuit 13 to obtain the validation signal S2.

The inputs signals $V_M$ and $V_R$ can have a random shape (sinusoidal, rectangular, trapezoidal, etc) in so far as at any time the measuring signal to be coded and the reference signal can be deduced from one another by similarity in construction and position. The rectangular shape is particularly advantageous for such a processing circuit because the indeterminateness of the ratio $V_M/V_R$ then only occurs at transition times (vertical fronts of squarewave signals). It should also be noted that the frequency 1/T of the signals only occurs in the process used, with the exception of the choice of clock time, so that this frequency can differ from one transducer to the next.

FIG. 4 shows the previously described processing circuit to which is added multiplexing means for processing a plurality of signals from N transducers. The digital subassembly 3 can form part of the computer equipping the system or can be constituted by an automaton, optionally in the form of a microprocessor. The multiplexing circuits 21 and 22 are sequentially controlled from the computer by a control S10 in such a way as to successively select the respective signals $V_{Mi}$ and $V_{Ri}$ during a given period of time T', said selection being repeated during the following period and so on. In synchronized manner, the values $\theta_{R1}$ to $\theta_{Rn}$ stored in a memory 40 are extracted in turn during each period T', so that $\theta_{Ri}$ is extracted when the pair $V_{Mi}$ and $V_{Ri}$ is selected. The switching time by signal S10 is equal to or a multiple of the clock cycle S0, depending on whether it is desired to process one or more samples at once. Thus, the value $\theta_{Ri}$ corresponds to that previously stored during the previous period T' or in consequence of the processing of the preceding sample. Block 15 represents the system of circuits 10, 12 and 13 of FIG. 1.

According to the presently described solution all the elements are multiplexed, leading to weight and volume saving and a more economic construction. The latter advantage also results from the digital-analog conversion, instead of analog-digital conversion as used in the prior art.

It is also pointed out that during each clock as the value $\theta_{Ri}$ can only be updated by one increment, any interference item which has been counted only leads to an error limited to a single integration quantity. Thus, the system produces an effective filtering of interference and an increase in reliability.

FIG. 5 relates to the application to an electrical flight control system. The electrical flight controls transmits position fixing commands to roll and air brake surfaces. These commands are processed by means of a digital computer from commands given by the pilot or copilot by operating the corresponding controls. A not shown roll wheel drives the rotor of an alternating inductive transducer CG whose the armature winding supplies the command $V_{MG}$. An air brake lever, not shown, in the same way drives a second transducer of the linvar type CF whose the armature winding supplies the command $V_{MF}$. These commands with the corresponding reference voltages $V_{RG}$ and $V_{RF}$ are transmitted to a processing circuit 30 according to the invention represented in a block 31 designating said circuit together with the digital computer and its peripheral circuits. The roll and air brake surfaces 32-1 to 32-n have in each case a position control means such as a jack 33-j energised by a corresponding command $V_{Cj}$ and a transducer $C_{Rj}$ ensuring the position recopying by the corresponding induced signal $V_{Mj}$. The recopying signals $V_{M1}$ to $V_{Mn}$ and the reference signals $V_{R1}$ to $V_{Rn}$ are transmitted to circuit 30. By means of aircraft parameters SP (proper speed, Mach number, etc) of data $\theta_{RG}$, $\theta_{RF}$ and $\theta_{R1}$ to $\theta_{Rn}$ processed in the manner described hereinbefore the computer determines the position fixing command $V_{C1}$ to $V_{Cn}$ and ensures the relooping of the hydraulic servo-controls, together with the monitoring of the system. In this application, the number n can be equal to six, giving to use height transducers of the linvar type. The linvars can be rotary for the pilot control ($C_G$ and $C_F$) and linear for recopying the positions of the control surfaces ($C_{R1}$ to $C_{Rn}$).

Linvars are linear inductive potentiometer transducers which form a voltage proportional to a position by varying the coupling between a primary winding supplied by an alternating reference voltage $V_R$ and a secondary winding which supplies the induced signal $V_M$. The secondary winding or rotor is moved in the rotary linvar and the induced voltage is proportional to the rotation angle of the rotor with respect to an electrical zero position, to the voltage $V_R$ and to the primary-secondary transformation ratio K. In the linear linvar, the windings can be fixed and the coupling modified by linear displacement of a plunger, the transducer equation being identical and the angular displacement $\theta$ being replaced by the linear displacement. Means are generally provided for compensating the influence of temperature variations which modify the value of the transformation ratio K. These means can comprise a third winding. The acquisition of the linvars amounts to calculating the ratio $V_M/V_R$, said two voltages cancelling one another out at the same time and thus having only two possible states zero or $\pi$ for these phase displacements, signals in phase or in phase opposition.

The system described relative to FIG. 5 can be transposed to an comparable system having position controls and command and recopying transducers of the envisaged type. The invention can in particular be used in the digital control of machine tools.

What is claimed is:

1. A cyclic analog signal processing circuit, intended for processing signals from a plurality n of linvars, each linvar supplying an induced signal $V_{Mi}$ proportional to the displacement to be measured and to the reference signal $V_{Ri}$ supplying the transducer, said circuit comprising:

multiplexer means for successively transmitting the analog signals of the transducers, supplying the induced signal $V_{Mi}$ by a first output and the reference signal of the corresponding transducer by a second output;

a memory for successively storing the digital values $V_{Mi}/V_{Ri}$ representative of the respective displacements of the transducers, said memory being relooped on itself across an adder-subtracter circuit;

a multiplier for multiplying the reference signal $V_{Ri}$ of the second output by the corresponding value $V_M/V_R$ extracted from the memory and being converted in analog form in a digital-analog conversion circuit;

control means comprising a differential comparator with a digital output for comparing the output of the multiplier with the induced signal $V_{Mi}$ of the first output and for supplying a binary control signal; and a circuit for the incrementation and decrementation control of the adder-subtracter circuit as a function of the state of said binary control signal.

2. A circuit according to claim 1, wherein said control means comprises a second comparator with a digital output receiving the reference signal and supplying the information of corresponding sign of said signal and an exclusive-OR circuit supplied by two comparators and supplying the binary incrementation-decrementation signal to the adder-subtracter.

3. A circuit according to claim 2, wherein said control means comprises means for validating the incrementation-decrementation control for an amplitude of the reference signal outside a given range $+V_1$ to $-V_2$ corresponding to the synchronous zero passages of the signals $V_{Mi}$ and $V_{Ri}$ to be processed.

4. A circuit according to claim 3, wherein the validation means incorporate the second comparator for comparing the reference signal with a positive voltage $+V_1$, a third comparator with a digital output for comparing this signal with a negative voltage $-V_2$ and an OR circuit supplied by the outputs of the second and third comparators and supplying a corresponding validation signal to the adder-subtracter.

5. A circuit according to any one of claims 1 to 4, wherein the memory and adder-subtracter circuit form part of a microprocessor ensuring the timing of the successive memory sampling operations and which controls the multiplexer.

6. A circuit according to claim 4, wherein the memory and adder-subtracter circuit form part of a digital computer ensuring the timing of the successive memory sampling operations and which controls the multiplexer.

7. A circuit according to claim 4 or 6 applied to an electrical flight control system in which the transducers of the linvar type comprise a transducer providing a roll command, a transducer providing an air brake command and a plurality of recopying transducers, the latter being distributed over the respective surfaces to be controlled by means of servo-controls, said processing circuit and the digital computer processing on the basis of the roll and air brake commands, together with the recopying signals the commands of the surface servo-control means.

* * * * *